United States Patent [19]

Yamamura et al.

[11] Patent Number: 4,504,571
[45] Date of Patent: Mar. 12, 1985

[54] METHOD OF PEEL DEVELOPMENT

[75] Inventors: Yutaka Yamamura; Tomomichi Kaneko; Shunichi Hayashi, all of Osaka, Japan

[73] Assignee: Nitto Electric Industrial Co., Ltd., Osaka, Japan

[21] Appl. No.: 595,128

[22] Filed: Mar. 30, 1984

[30] Foreign Application Priority Data

Mar. 31, 1983 [JP] Japan ................................. 58-57108

[51] Int. Cl.³ ............................ G03C 1/68; G03F 7/26
[52] U.S. Cl. ..................................... 430/253; 156/234
[58] Field of Search ............... 430/253, 254; 156/234, 156/344, 584

[56] References Cited

U.S. PATENT DOCUMENTS 3,794,546  2/1974  Cohen et al. ........................ 430/254
4,357,413 11/1982  Cohen et al. ........................ 430/253

Primary Examiner—Richard L. Schilling

Attorney, Agent, or Firm—Sughrue, Mion, Zinn, Macpeak & Seas

[57] ABSTRACT

A method of peel development comprising laminating an image-forming material comprising a transparent support and a photopolymerizable composition layer on the surface of a substrate on which an image is formed, imagewise exposing the image-forming material, and peeling the support from the substrate together with the unexposed areas of the photopolymerizable composition layer while leaving the exposed areas thereof on the substrate, wherein the cohesive strength of the photopolymerizable composition layer is set such that the force required to separate the unexposed areas from the exposed areas is at least 1.0 kg/mm² and the peeling operation is performed while maintaining a peel angle ($\alpha$) of the support to the substrate within the range of $0° < \alpha \leq 90°$. This method enables the formation of sharp images on the substrate while allowing for the easy separation of the unexposed areas from the exposed areas.

3 Claims, 7 Drawing Figures

METHOD OF PEEL DEVELOPMENT

FIELD OF THE INVENTION

The present invention relates to a method of peel development for use in the preparation of, for example, printed circuits.

BACKGROUND OF THE INVENTION

For the preparation of, e.g., printed circuits, an image-forming method has been developed comprising adhering an image-forming material, comprising a transparent support having adhered thereon a photopolymerizable composition layer, onto the surface of an image-forming substrate in such a manner that the photopolymerizable composition layer is in contact with the substrate; imagewise exposing the photopolymerizable composition layer to form the corresponding cured areas and; if necessary, heating the image-forming material; and peeling away the support from the substrate to form a resist image on the substrate.

In image-forming materials of the type as described above, the cohesive strength of the photopolymerizable composition layer is generally set at a relatively low level so that the unexposed areas of the photopolymerizable composition layer can be easily separated from the exposed areas, i.e., cured areas, even if the support is peeled away from the substrate at any peel angle. However, this causes the problem that at any portions of the unexposed areas of the photopolymerizable composition layer, a sharp image line cannot be formed. Hence, from the viewpoint of forming sharp images, it is desirable for the above-described cohesive strength to be increased so that the unexposed areas can be sharply separated from the exposed areas.

When the cohesive strength of the photopolymerizable composition layer is set at a high level, sharp image lines can be formed since the stress caused in the photopolymerizable composition layer during the peeling operation can be concentrated at the boundaries between the exposed areas and the unexposed areas, although some difficulty is encountered in the separation of the unexposed areas from the exposed areas. If the cohesive strength is increased excessively, the separation of the unexposed areas from the exposed areas becomes more difficult. For example, in pattern 1 with many corners as shown in FIG. 1, residual strips 2 of the unexposed areas tend to remain at the sides of edges in the peeling direction (indicated by an arrow (a)) of the corners.

Extensive investigations have been conducted on the problem of making the unexposed areas of the photopolymerizable composition layer easily separable from the exposed areas and forming sharp images by increasing the cohesive strength to achieve the present invention.

SUMMARY OF THE INVENTION

An object of the present invention is to provide a method of peel development which enables formation of sharp images while maintaining the unexposed areas of a photopolymerizable composition layer easily separable from the exposed areas.

The above object has been met in the present invention by a method of peel development comprising:

(a) laminating an image-forming material comprising a transparent support and a photopolymerizable composition layer on the surface of a substrate on which an image is formed;

(b) imagewise exposing the image-forming material; and then (c) peeling away the transparent support and the unexposed areas of the photopolymerizable composition layer from the substrate to retain the exposed areas of the photopolymerizable composition layer on the substrate, wherein the cohesive strength of the photopolymerizable composition layer is adjusted such that the force required to separate the unexposed areas from the exposed areas is at least 1.0 kg/mm$^2$ and the peeling operation is performed while maintaining a peel angle ($\alpha$) of the support to the substrate within the range of $0° < \alpha \leq 90°$.

11—Substrate
12—Image-forming material
13—Transparent support
14—Photopolymerizable composition layer
14a—Exposed areas
14b—Unexposed areas
$\alpha 1, \alpha 2, \alpha 3$—peel angles

DETAILED DESCRIPTION OF THE INVENTION

As stated above, the method of peel development of the present invention comprises:

(a) laminating an image-forming material comprising a transparent support and a photopolymerizable composition layer on the surface of a substrate on which an image is formed;

(b) imagewise exposing the image-forming material; and then (c) peeling away the transparent support and the unexposed areas of the photopolymerizable composition layer from the substrate to retain the exposed areas of the photopolymerizable composition layer on the substrate, wherein the cohesive strength of the photopolymerizable composition layer is adjusted such that the force required to separate the unexposed areas from the exposed areas is at least 1.0 kg/mm$^2$ and the peeling operation is performed while maintaining a peel angle ($\alpha$) of the support to the substrate within the range of $0° < \alpha \leq 90°$.

According to the method of peel development of the present invention, the cohesive strength of the photopolymerizable composition layer is set such that the force required to separate the unexposed areas from the exposed areas is at least 1.0 kg/mm$^2$, preferably 1.0 to 2.0 kg/mm$^2$. Within the range of this force, the stress caused in the photopolymerizable composition layer during the peeling operation is concentrated at the boundaries between the exposed areas and the unexposed areas and sharp image lines can be formed.

The cohesive strength corresponds to the cohesive strength of the unexposed areas of the photopolymerizable composition layer, i.e., the cohesive force of the photopolymerizable composition layer prior to exposure.

The cohesive strength of the photopolymerizable composition layer can be easily set within the above specific range by varying the amounts of components (monomer, polymer, etc.) for the composition.

The cohesive strength defined in the present invention can be measured in terms of the force required to separate the exposed areas from the unexposed areas in the following manner.

A photopolymerizable composition layer having a thickness of 37 μm and a width of 25 mm is laminated on a copper plate to prepare a photomask having exposed areas and unexposed areas alternatingly. The photomask is then subjected to contact exposure and thereafter the resist layer is peeled away from the copper plate at a peel rate of 0.5 m/min at room temperature (about 23° C.). The peel strength is then measured with a tensile tester.

The mechanism of peel development of the present invention is explained in detail by reference to the accompanying drawings.

Figure 2:
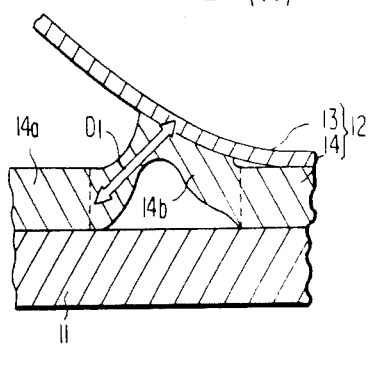
FIGS. 2(A), 2(B) and 2(C) each illustrate the rate of deformation of the unexposed area during the support-peeling operation.
Figure 2:
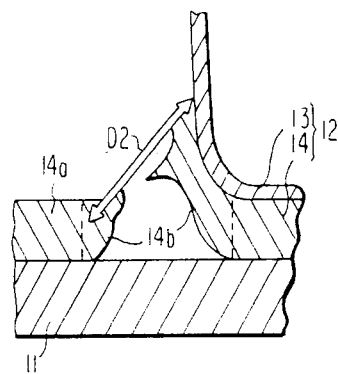
Figure 2:
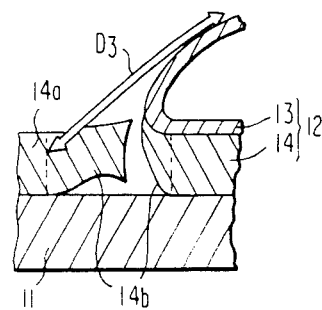
Figure 3:
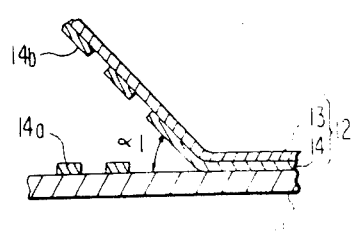
FIGS. 3(A), 3(B) and 3(C) illustrate the peeling condition in which the support is peeled at peel angles corresponding to FIGS. 2(A), 2(B) and 2(C), respectively.
Figure 3:
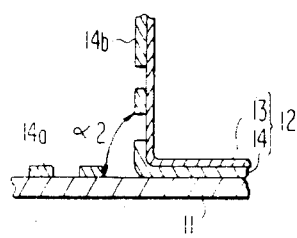
Figure 3:
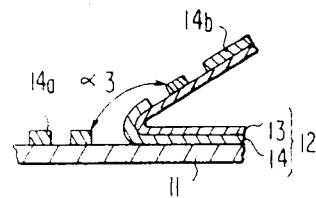

FIGS. 2 and 3 show the cross-section of a substrate 11 and an image-forming material 12 comprising a transparent support 13 and a photopolymerizable composition layer 14 provided on the substrate 11 where the support 13 is peeled away from the substrate 11. The reference numerals 14a and 14b indicate the exposed and unexposed areas, respectively, of the photopolymerizable composition layer 14.

In the course of peeling, with movement of the support 13, the unexposed area 14b of the photopolymerizable composition layer 14 is pulled and separated from the exposed area 14a as shown in FIGS. 2(A), 2(B) and 2(C). The distance over which the unexposed area 14b is pulled apart from the boundary between the exposed areas and the unexposed areas per unit time varies depending on the peel angle. The distances in FIGS. 2(A), 2(B) and 2(C) are referred to as "$D_1$", "$D_2$" and "$D_3$", respectively.

Figure 1:
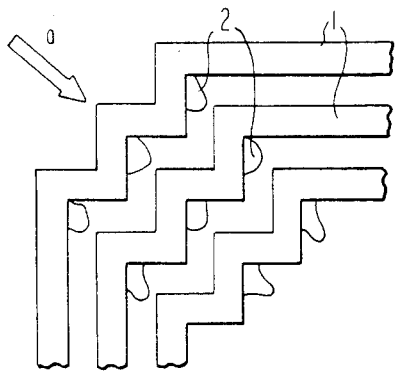
FIG. 1 illustrates the phenomenon that a portion of the unexposed areas is unremoved in the conventional method of peel development.

When the peel angle is small as in FIG. 2(A) ($\alpha_1 < 90°$), the distance $D_1$ is small. On the other hand, if the peel angle is increased as in FIGS. 2(B) and 2(C) ($\alpha_2$ and $\alpha_3$, in FIGS. 3(B) and 3(C) $\geq 90°$), the distances $D_2$ and $D_3$ are greater than $D_1$. This shows that the rate of deformation of the unexposed area 14b varies with the peel angle. At a peel angle at which the rate of deformation is very high, as in FIG. 2(C), the unexposed area exhibits more elastic properties as compared with those in FIGS. 2(A) and 2(B). Therefore, in the case of FIG. 2(C), the unexposed area 14b cannot follow the movement of the support 13 and a portion of the unexposed area 14b remains on the substrate 11 as a strip 2 (as shown in FIG. 1).

Hence, in the present invention, the peel angle α of the support relative to the substrate 11 is adjusted within the range of $0° < \alpha \leq 90°$, preferably $60° \leq \alpha \leq 90°$. In this manner, the rate of deformation of the unexposed area 14a is small and, as a result, even if the cohesive strength of the photopolymerizable composition layer is set at a relatively high value (near 2.0 kg/mm²), the phenomenon that a portion of the unexposed area remains unremoved does not occur.

The peel rate of the support is not particularly limited but is generally 0.5 to 3.0 m/min.

The method of peel development according to the present invention is generally conducted at a temperature of 15° to 50° C. although not particularly limited thereto.

Furthermore, the photopolymerizable composition is not particularly limited and any conventional photopolymerizable compositions can be applied to the method of the present invention so long as it satisfies the requirement of the cohesive strength.

The present invention is described in greater detail by reference to the following non-limiting examples.

EXAMPLE 1

A pattern as shown in FIG. 1 was printed on an image-forming material with a photopolymerizable composition layer shown below, the cohesive strength of which was adjusted such that the force required to separate the unexposed areas of the photopolymerizable composition Layer from the exposed areas was at least 1.0 kg/mm². Peel development was performed at a small peel angle ($\alpha_1 = 45°$) as in FIG. 3(A). The unexposed areas were completely removed and residual strips as shown in FIG. 1 did not remain on the substrate.

| Photopolymerizable Composition | |
|---|---|
| Polymetyl methacrylate ("Dianal BR-75", manufactured by Mitsubishi Rayon Co.) | 60 g |
| Chlorinated polyethylene ("Super Chlon CPE-907HA", manufactured by Sanyo Kokusaku Pulp Co.) | 35 g |
| Saturated Polyester ("Vylon #200", manufactured by Toyo Boseki Co.) | 5 g |
| Polyfunctional oligoester acrylate ("Aronix M-8060", manufactured by Toa Gosei Chemical Industry Co.) | 28 g |
| Bifunctional acrylate ("Viscoat 700", manufactured by Osaka Yuki Kagaku Kogyo Co.) | 70 g |
| Bifunctional methacrylate ("Aranix M-6300", manufactured by Toa Gosei Chemical Industry Co.) | 42 g |
| Dye (Victoria Pure Blue) | 0.2 g |
| p-Methoxyphenol | 0.1 g |
| Benzophenone | 4 g |
| Michler's Ketone | 0.5 g |

COMPARATIVE EXAMPLE 1

The procedure of Example 1 was repeated except that the peel angle was increased as in FIG. 3(C) ($\alpha_3 = 135°$). The unexposed areas were completely removed and strips, as shown in FIG. 1, were left on nearly the entire surface of the substrate.

EXAMPLE 2

The procedure of Example 1 was repeated except that the peel angle ($\alpha_2$) was set at 90° as shown in FIG. 3(B). The unexposed areas were completely removed and no strips as shown in FIG. 1 remained on the substrate.

COMPARATIVE EXAMPLE 2

A pattern as shown in FIG. 1 was printed on an image-forming material with a photopolymerizable composition layer shown below, the cohesive strength of which was set such that the force required to separate the unexposed areas from the exposed areas was about 0.8 kg/mm². Peel development was performed at various peel angles as shown in FIGS. 3(A) to 3(C). No strips, as shown in FIG. 1, remained on the substrate.

However, the image lines were not sharp but, were jagged.

| Photopolymerizable Composition | |
|---|---|
| Polymetyl methacrylate ("Dianal BR-75", manufactured by Mitsubishi Rayon Co.) | 20 g |
| Chlorinated polyethylene ("Super Chlon CPE-907HA", manufactured by Sanyo Kokusaku Pulp Co.) | 75 g |
| Saturated Polyester ("Vylon #200", Manufactured by Toyo Boseki Co.) | 5 g |
| Polyfunctional Oligoester acrylate ("Aronix M-8060", manufactured by Toa Gosei Chemical Industry Co.) | 32 g |
| Bifunctional acrylate ("Viscoat 700", manufactured by Osaka Yuki Kagaku Kogyo Co.) | 80 g |
| Bifunctional methacrylate ("Aranix M-6300", manufactured by Toa Gosei Chemical Industry Co.) | 48 g |
| Dye (Victoria Pure Blue) | 0.2 g |
| p-Methoxyphenol | 0.1 g |
| Benzophenone | 4 g |
| Michler's Ketone | 0.5 g |

In accordance with the method of peel development of the present invention in which the cohesive strength of the photopolymerization composition layer is set at a relatively high value and the support is peeled away from the substrate at a specific peel angle, the peeling operation can be performed smoothly and the degree of sharpness of the image can be greatly increased.

While the invention has been described in detail and with reference to specific embodiments thereof, it will be apparent to one skilled in the art that various changes and modifications can be made therein without departing from the spirit and scope thereof.

What is claimed is:

1. A method of peel development comprising:
   (a) laminating an image-forming material comprising a transparent support and a photopolymerizable composition layer on the surface of a substrate on which an image is formed;
   (b) imagewise exposing the image-forming material; and then
   (c) peeling away the support and the unexposed areas of the photopolymerizable composition layer from the substrate to retain the exposed areas thereof on the substrate,
   wherein the cohesive strength of the photopolymerizable composition layer is set such that the force required to separate the unexposed areas from the exposed areas is at least 1.0 kg/mm$^2$ and the peeling operation is performed while maintaining a peel angle ($\alpha$) of the support to the substrate within the range of $0° < \alpha \leq 90°$.

2. The method of claim 1, wherein the peel angle ($\alpha$) is within the range of $60° \leq \alpha \leq 90°$.

3. The method of claim 1, wherein the force is 1.0 to 2.0 kg/mm$^2$.

* * * * *